(12) United States Patent
Heaney

(10) Patent No.: US 8,570,025 B2
(45) Date of Patent: Oct. 29, 2013

(54) POWER DELIVERY CIRCUIT WITH LOAD CURRENT ESTIMATION BASED ON MONITORING NODES NOT ON THE POWER DELIVERY PATH

(75) Inventor: Eugene Heaney, Cork (IE)

(73) Assignee: Ferfics Limited, Cork (IE)

( * ) Notice: Subject to any disclaimer, the term of this patent is extended or adjusted under 35 U.S.C. 154(b) by 542 days.

(21) Appl. No.: 12/734,716

(22) PCT Filed: Nov. 20, 2008

(86) PCT No.: PCT/IE2008/000111
§ 371 (c)(1),
(2), (4) Date: May 19, 2010

(87) PCT Pub. No.: WO2009/066274
PCT Pub. Date: May 28, 2009

(65) Prior Publication Data
US 2011/0115507 A1    May 19, 2011

(30) Foreign Application Priority Data

Nov. 20, 2007  (IE) .................................... 2007/0846

(51) Int. Cl.
*G01R 19/00*    (2006.01)
*G01R 27/08*    (2006.01)

(52) U.S. Cl.
USPC ................... 324/76.11; 324/764.01; 324/705

(58) Field of Classification Search
None
See application file for complete search history.

(56) References Cited

U.S. PATENT DOCUMENTS

| 4,382,229 | A | * | 5/1983 | Cottrell et al. ............ 324/762.09 |
| 5,426,334 | A | * | 6/1995 | Skovmand ..................... 327/427 |
| 5,905,384 | A | * | 5/1999 | Inoue et al. ............. 324/762.09 |
| 6,049,213 | A | * | 4/2000 | Abadeer ....................... 324/719 |
| 6,437,607 | B1 | | 8/2002 | Milanesi |
| 2004/0027762 | A1 | | 2/2004 | Ohi |
| 2005/0014473 | A1 | | 1/2005 | Zhao |

FOREIGN PATENT DOCUMENTS

| EP | 0 353 406 | 2/1990 |
| EP | 0 866 557 | 9/1998 |
| JP | 60 167679 | 8/1985 |
| JP | 03 269265 | 11/1991 |

\* cited by examiner

*Primary Examiner* — Vinh Nguyen
(74) *Attorney, Agent, or Firm* — Jacobson Holman PLLC

(57) ABSTRACT

A power delivery circuit has power delivery components and a load ($Z_T$) terminal, detectors for measuring voltages at two or more measuring nodes ($V_1$, $V_3$) of the power delivery circuit, and an estimation circuit for using the measurements to estimate current, voltage, or power delivered to a load by the power delivery circuit. The detectors may measure voltages at nodes of transistor switches of the power delivery circuit, particularly at the gates. The power delivery circuit may have switches in series, and the detectors measure voltages at nodes of only a subset of the switches. The detectors in one example measure switch voltages and the estimation circuit estimates power delivered to the load according to a switch voltage and impedance between two nodes of the switch. The switch impedance may be provided during calibration using a reference load. The estimation circuit may be a simple analogue circuit such as an amplifier (AMP1) and a multiplexer (MX1). The circuit is of particular benefit for measuring power delivered to a load of unknown impedance, such as an antenna of a mobile phone.

15 Claims, 10 Drawing Sheets

Fig. 5 (a) (PRIOR ART)

SP9T Switch with Integrated Detector (Multimode Front End with 5 PA Line Up)

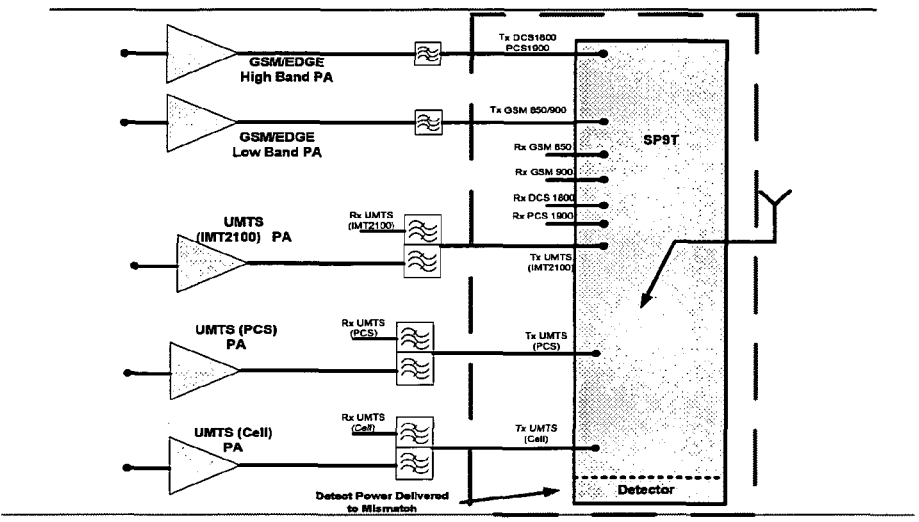

Fig. 18

For a 10:1 Load VSWR and an available Power of 30dBm from a PA, the method shows an error of less than 0.1dB in sensing the power delivered to the antenna over all phases and with no impact on Insertion Loss.

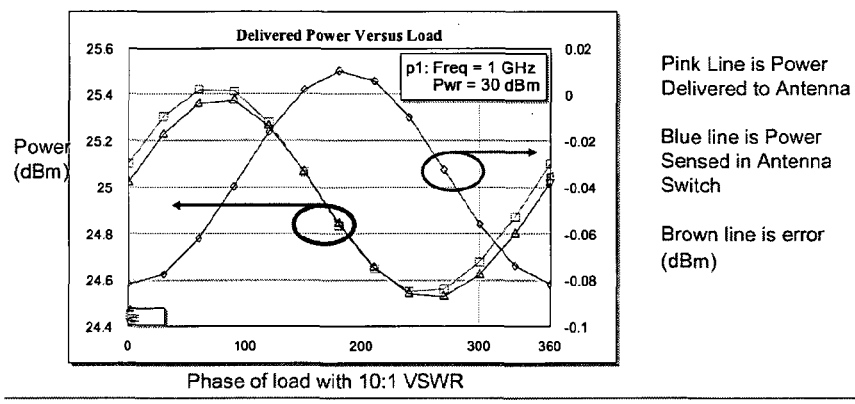

Pink Line is Power Delivered to Antenna

Blue line is Power Sensed in Antenna Switch

Brown line is error (dBm)

Fig. 19

POWER DELIVERY CIRCUIT WITH LOAD CURRENT ESTIMATION BASED ON MONITORING NODES NOT ON THE POWER DELIVERY PATH

This is a national stage of PCT/IE08/000,111 filed Nov. 20, 2008 and published in English, which has a priority of Irish no. 2007/0846 filed Nov. 20, 2007, hereby incorporated by reference.

INTRODUCTION

1. Field of the Invention

The invention relates to monitoring of electrical circuits including switches.

2. Prior Art Discussion

Switches can be represented functionally by FIG. 1(a) and FIG. 1(b). In FIG. 1(a) the switch is said to be open and an electrical signal cannot flow from node A to node B, whereas in FIG. 1(b) the switch is said to be closed an electrical signal can flow from node A to node B. In the example of transistors being the switches, in FIG. 2(a) the transistor is biased 'OFF' by applying a bias voltage $V_{LO}$ to the gate of the transistor, in such a way that the channel between the drain and source of the transistor is closed and no current flows between the drain and source. In this way FIG. 2(a) is electrically equivalent to FIG. 1(a). Similarly, in FIG. 2(b) the transistor is biased 'ON' by applying a bias voltage $V_{HI}$ to the gate of the transistor, in such a way that the channel between the Drain and Source of the transistor is open and current can flow between the Drain and Source. In this way FIG. 2(b) is electrically equivalent to FIG. 1(b).

The circuits in FIG. 2 show the switch being implemented with a single transistor. Equally so, the switch can be implemented using a series of transistors in cascade or 'stacked'. For example FIG. 3(a) shows three transistors in series with each gate biased through a resistor by a voltage $V_{LO}$, so that all three transistors are turned off and no current can flow between node A and node B. Thus FIG. 3(a) is electrically equivalent to FIG. 1(a). Similarly FIG. 3(b) shows three transistors in series with each gate biased through a resistor by a voltage $V_{HI}$, so that all three transistors are turned on and current can flow between node A and node B. Thus 3(b) is electrically equivalent to FIG. 1(b).

As described above, when a switch is 'ON' it allows current to flow from node A to node B. Node B will have a terminating impedance, defined here as $Z_T$, and shown schematically in FIG. 4, into which the current will flow. This terminating impedance $Z_T$ may be known or may not be known.

In some applications it is useful to know the power delivered to the terminating impedance $Z_T$. The power delivered ($P_D$) is defined as $$P_D = \text{Real Part}(V_T^* I_T), \qquad \text{Equation (1)}$$

where $V_T$ is the voltage across the terminating impedance $Z_T$, and $I_T$ is the current through the terminating impedance, and the voltages and currents are rms values.

To illustrate other types of switch functions FIG. 5 shows a functional schematic for a Single Pole Double Throw (SPDT) switch, so called because it is used to connect a single node (in this case node B) to one of two nodes (in this case either node A or node C). In FIG. 5(a) the schematic shows the switch being controlled in such a way as to connect node A to node B and leave the connection between node B and node C open. In FIG. 5(b) the schematic shows the same switch being controlled in such a way as to connect node C to node B and leave the connection between node B and node A open.

Another example of a switch function is a Single Pole Four Throw (SP4T) switch. A schematic of such a switch is shown in FIG. 6 where the function of the switch is to connect node B to one of either four nodes A, C, D or E. As drawn the switch is controlled to connect node B to node A. FIG. 7 shows another example of a switch function. It is a Double Pole Double Throw Switch (DPDT) so called because its function is to connect one of either two nodes (here node A or node E) to one of either two nodes (here node C or node D). As is drawn in FIG. 7 the switch is controlled to connect node A with node D through node B.

It is known how to calculate the power delivered by a switch to a terminating impedance when the terminating impedance is known. However it is often the case that one wishes to know the power delivered to the terminating impedance when the terminating impedance is not known. This situation arises for example in mobile phones where the impedance of the antenna varies depending on the position of the phone (for example whether the phone is lying on metal, in open space, or close to the head).

The invention addresses the problem of determining the power delivered to a terminating impedance of a switch when the terminating impedance is not known.

SUMMARY OF THE INVENTION

According to the invention, there is provided a power delivery circuit comprising power delivery components and a load terminal, detectors for measuring voltages at two or more measuring nodes of the power delivery circuit, and an estimation circuit for using the measurements to estimate current, voltage, or power delivered to a load by the power delivery circuit.

In one embodiment, at least one of the detectors is adapted to measure voltage at a node of a switch of the power delivery circuit.

In one embodiment, the switch is a transistor, such as FETs.

In one embodiment, at least one detector is adapted to measure voltage at a node of an attenuator. In one embodiment, the attenuator comprises transistors operating as variable resistors.

In one embodiment, at least one of the detectors is adapted to measure leakage voltages at a gate of an OFF transistor.

In one embodiment, the estimation circuit is adapted to means estimate load current $I_T$ by $I_T = (V_S - V_T)/Z$, where
  $V_S$ is voltage at one node,
  $V_T$ is voltage at another node,
  $Z$ is the impedance between the nodes.

In one embodiment, the circuit comprises a plurality of switches in series, and the detectors are adapted to measure voltages at nodes of only a subset of the switches.

In one embodiment, at least some detectors are adapted to measure switch voltages and the estimation circuit is adapted to estimate power delivered to the load according to a switch voltage and impedance between two nodes of the switch.

In one embodiment, the power delivery circuit comprises a plurality of attenuators in series, and the detectors are adapted to measure voltages at nodes of a subset of the attenuators.

In one embodiment, the power delivery circuit includes a single pole double throw (SPDT) switch.

In one embodiment, the circuit further comprises means for multiplexing node voltages to detectors, allowing a greater number of nodes than detectors.

In one embodiment, the estimation circuit is a fully analogue circuit.

In one embodiment, the analogue circuit comprises a differential amplifier connected to receive as inputs two or more sensed voltages at nodes and to provide as output a voltage proportional to current delivered to the load.

In one embodiment, the analogue circuit further comprises a multiplier for receiving the amplifier output and a load voltage signal to provide an output indicating load power.

In one embodiment, at least one node is not on a power delivery path of the power delivery circuit.

In one embodiment, at least one node is connected to a gate of a transistor on the power delivery path to measure leakage voltages.

In one embodiment, at least one node is connected to a gate of a transistor on the power delivery path via biasing circuits including resistors.

In one embodiment, at least one detector comprises an electromagnetic coupler, and a measuring node is linked to the power delivery path via said electromagnetic coupler, and the detector is adapted to measure voltage at the measuring node said voltage being representative of current in the power delivery path to the load.

In one embodiment, another detector is arranged to measure voltage at a power switch gate or at a node connected to the gate through biasing circuits, providing a voltage representative of the voltage at the load.

In one embodiment, the estimation circuit is adapted to estimate output power by multiplying the voltage representative of current in the power delivery path to the load and the voltage representative of the voltage at the load.

In another aspect, the invention provides a communication device comprising a power delivery circuit of any embodiment above delivering power to an output.

In a further aspect, the communication device is a wireless communication device such as a mobile phone or WLAN device.

DETAILED DESCRIPTION OF THE INVENTION

Brief Description of the Drawings

The invention will be more clearly understood from the following description of some embodiments thereof, given by way of example only with reference to the accompanying drawings in which:—

FIGS. 8 to 18 are circuit diagrams for circuits of the invention, and

FIG. 19 is a plot showing circuit simulations.

DESCRIPTION OF THE EMBODIMENTS

In the present invention voltages are measured at multiple nodes of a power delivery circuit and these values are used to estimate the current, voltage or power delivered to the terminating impedance and the voltage across the terminating impedance.

Figure 8:
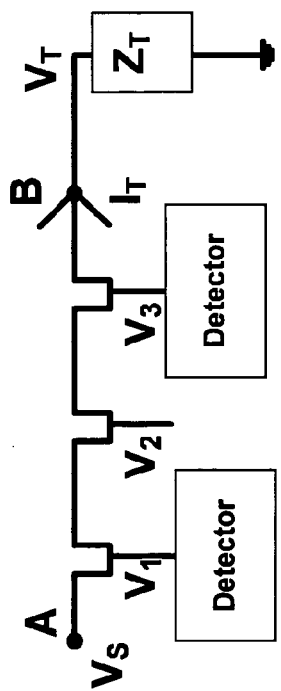

In various embodiments, the power delivered to the load is estimated by detecting voltages at two different measuring nodes in switch transistors or at nodes where the voltages are proportional to the voltages at the transistors. Referring to FIG. 8 a switch comprising three transistors in series connects nodes A and B. The power delivered to the terminating impedance is equal to the Real Part($V_T^* I_T$).

The current delivered to the load $I_T$, is given by $$I_T = (V_S - V_T)/Z_{ONSW} \qquad \text{Equation (2)}$$

where $V_T$ is the voltage at node B, $V_S$ is the voltage at node A, and $Z_{ONSW}$ is the impedance across the switch between the nodes A and B when the transistors are turned on.

More generally, the impedance value is the impedance between the two nodes. The voltage is not necessarily measured directly at the relevant nodes, and instead could be via components such as resistors, capacitors, transistors, diodes, or inductors.

Referring to FIG. 8 in a power delivery circuit for switching a detector is connected to the gates of the first and third transistors, to measure voltages $V_1$ and $V_3$, and an estimation circuit (not shown) is connected to the two detectors. Each detector comprises a diode and RC circuit, but could comprise any suitable circuit for detecting voltage such as a log detector or an envelope detector, or an RMS detector. The estimation circuit comprises digital logic embedded in a microprocessor of a host device the power delivery circuit. In some of the following drawings the estimation circuit is not shown, for clarity.

The voltage dropped across the switch is distributed evenly across the transistors. In the case shown in FIG. 8 the voltages $V_1$, $V_2$ and $V_3$ can be deduced by $$V_1 = V_S - (V_S - V_T)/6 \qquad \text{Equation (3)}$$

$$V_2 = V_S - (V_S - V_T)/2 \qquad \text{Equation (4)}$$

$$V_3 = V_S - 5^*(V_S - V_T)/6 \qquad \text{Equation (5)}$$

By measuring any two of the voltages $V_1$, $V_2$ and $V_3$, then the voltage drop across the switch can be deduced. For example by measuring $V_1$ and $V_3$ and using equations (3) and (5) the circuit can deduce that $$V_S - V_T = 3^*(V_1 - V_3)/2 \qquad \text{Equation (6)}$$

$$V_T = (5^* V_3 - V_1)/4 \qquad \text{Equation (7)}$$

Combining equations (6) and (7) with (1) and (2) the circuit can deduce that the power delivered to the load $P_D$ can be given by $$P_D = \text{Real Part}((18^* V_1^* V_3 - 3^* V_1^2 - 15^* V_3^2)/8^* Z_{ONSW}) \qquad \text{Equation (8)}$$

In this way by measuring $V_1$ and $V_3$ and knowing the impedance across the switch $Z_{ONSW}$, the circuit can deduce the power delivered to the terminating impedance $Z_T$ without knowing the terminating impedance. $Z_{ONSW}$ can for instance be implicitly determined during calibration because the estimation circuit takes a reference power output and corresponding reference measured voltages and from these deduce a calibration factor to account for $Z_{ONSW}$ which it stores. In other cases $Z_{ONSW}$ may be known from knowledge of the process technology and no calibration is required. Then, during use, the estimation circuit uses the calibration factor for $Z_{ONSW}$, or the known value, to determine the power delivered to the load from the measured voltages. The estimation circuit implements Eqn. 8. In a similar way the power delivered to the terminating impedance $Z_T$ can be deduced by measuring any two of the voltages $V_1$, $V_2$ and $V_3$ with a new expression similar to equation (8) derived for $P_D$ for whatever two voltages are measured.

Figure 1A:
FIGS. 1 to 7 are circuit diagrams referred to above in the Introduction.
Figure 1B:
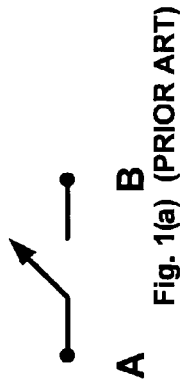
Figure 2A:
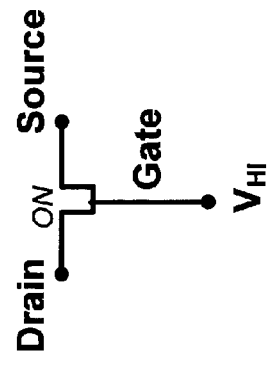
Figure 2B:
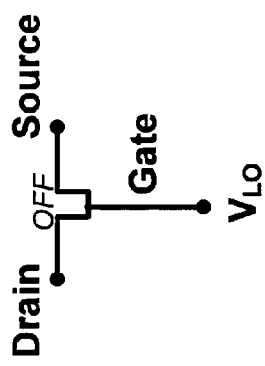
Figure 3A:
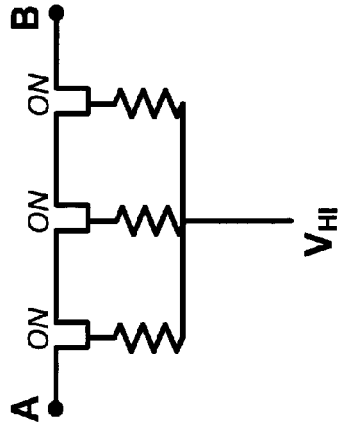
Figure 3B:
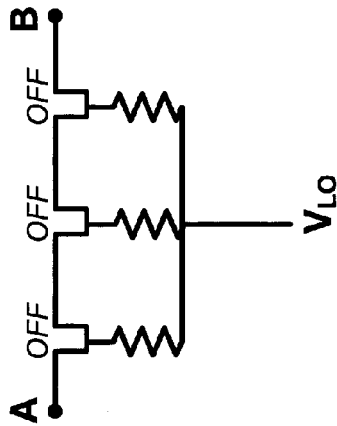
Figure 6:
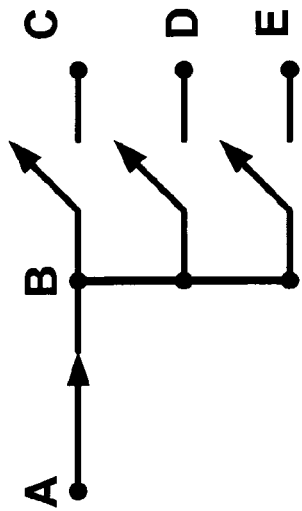
Figure 7:
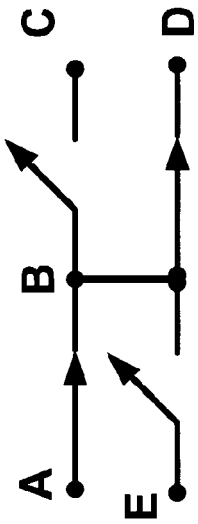
Figure 4:
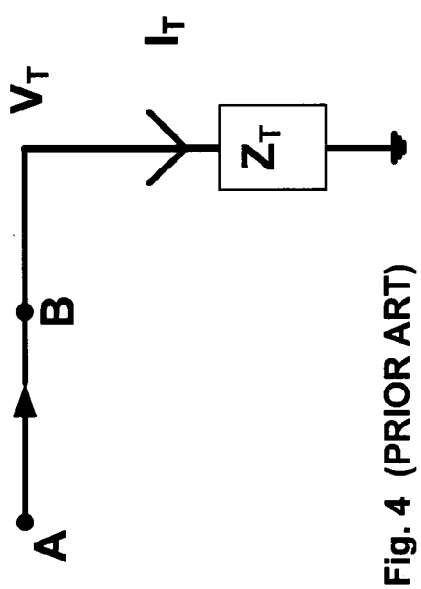
Figure 5B:
Figure 5B:
Figure 9:
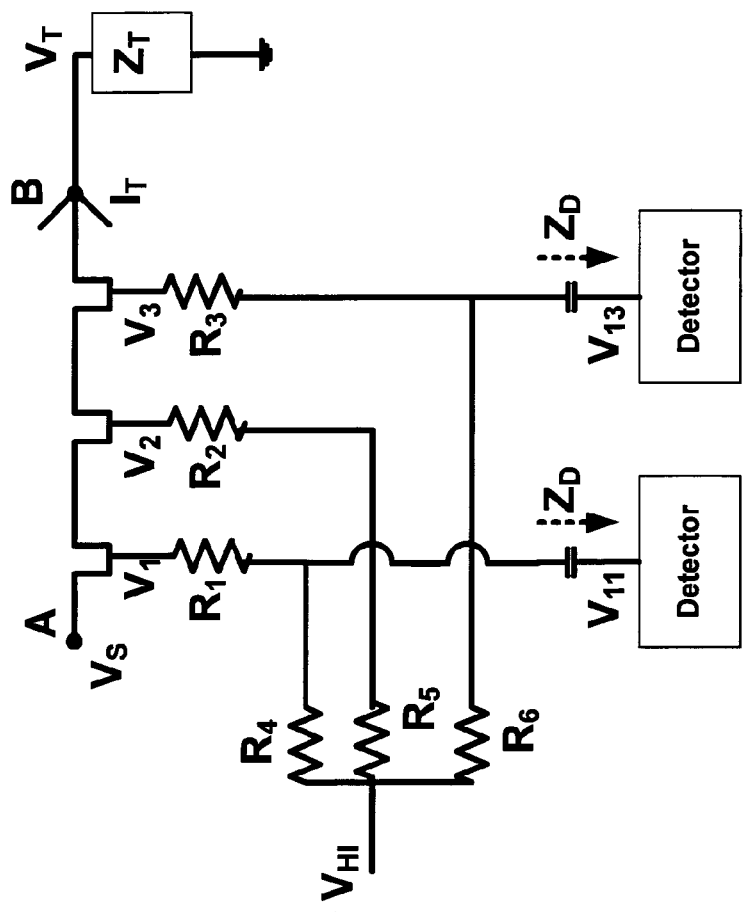

It may not be possible or desirable to measure the voltages $V_1$, $V_2$ and $V_3$ directly as measuring the voltage at these nodes may degrade the performance of the switch. For example, FIG. 9 shows another embodiment of the present invention. A switch composed of three transistors in series connects nodes A and B when a bias voltage $V_{HI}$ is applied so that transistors 1, 2 and 3 are 'ON'. The power delivered to the terminating impedance is, as before, equal to the Real Part($V_T^* I_T$).

When $R_1$, $R_2$ and $R_3$ are large compared to the impedance between node A and node B then the power delivered to the load $P_D$ can be approximated by Equation (8)

$$P_D = \text{Real Part}((18*V_1*V_3 - 3*V_1^2 - 15*V_3^2)/8*Z_{ONSW})$$

In this embodiment when $R_4$ and $R_6$ are much greater than $Z_D$, the input impedance looking into the detector, then:

$$V_1 = V_{11}*(Z_D + R_1)/Z_D \qquad \text{Equation (9)}$$

$$V_3 = V_{33}*(Z_D + R_3)/Z_D \qquad \text{Equation (10)}$$

Using equation (8) and with $R_1$ equal to $R_3$ the power delivered to the load $P_D$ can now be approximated by:

$$P_D = \text{Real Part}((18*V_{11}*V_{13} - 3*V_{11}^2 - 15*V_{13}^2)/ \\ 8*Z_{ONSW}*(Z_D + R_1)^2/Z_D^2) \qquad \text{Equation (11)}$$

In this way by measuring $V_{11}$ and $V_{13}$ and knowing the impedance across the switch $Z_{ONSW}$, an estimation circuit implementing Eqn. (11) can deduce the power delivered to the terminating impedance $Z_T$ without knowing the terminating impedance and without impacting the performance of the switch. This takes account of impact of the bias circuits and the detectors, so that there is no disadvantage arising from the fact that the measuring nodes are not directly at the gates of the switches.

FIGS. 8 and 9 show the topology of the switch being implemented with three transistors in series. Of course the switch can be implemented with any number of switches in series and equations similar to Equation (8) and Equation (11) can be derived in a similar way to measure the power delivered to the load for the given switch topology.

The present invention is applicable to any type of switch where the power delivered by the switch to the terminating impedance is measured through detecting voltages at two nodes within the switch, or at nodes connected to the gates of the transistors on the power delivery path via resistors, capacitors, transistors, diodes, and/or inductors or biasing circuits made up of such elements.

Figure 10:
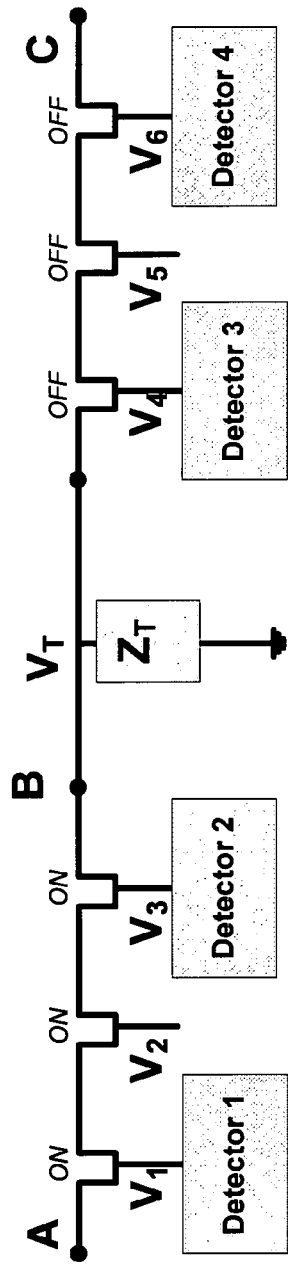
Figure 10:
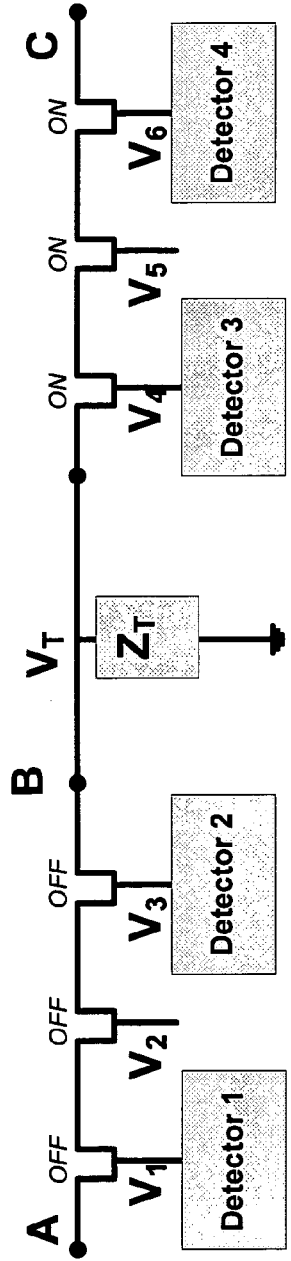

For example, FIG. 10 (a) shows an example of a SPDT switch controlled in such a way that the transistors connecting node A and node B are turned on and the transistors connecting node B and node C are turned off. Here the power delivered to the terminating impedance $Z_T$ is measured using Detector 1 and Detector 2.

FIG. 10 (b) shows the same SPDT switch controlled in such a way that the transistors connecting node A and node B are turned off and the transistors connecting node B and node C are turned on. Here the power delivered to the terminating impedance $Z_T$ is measured using Detector 3 and Detector 4.

Figure 11:
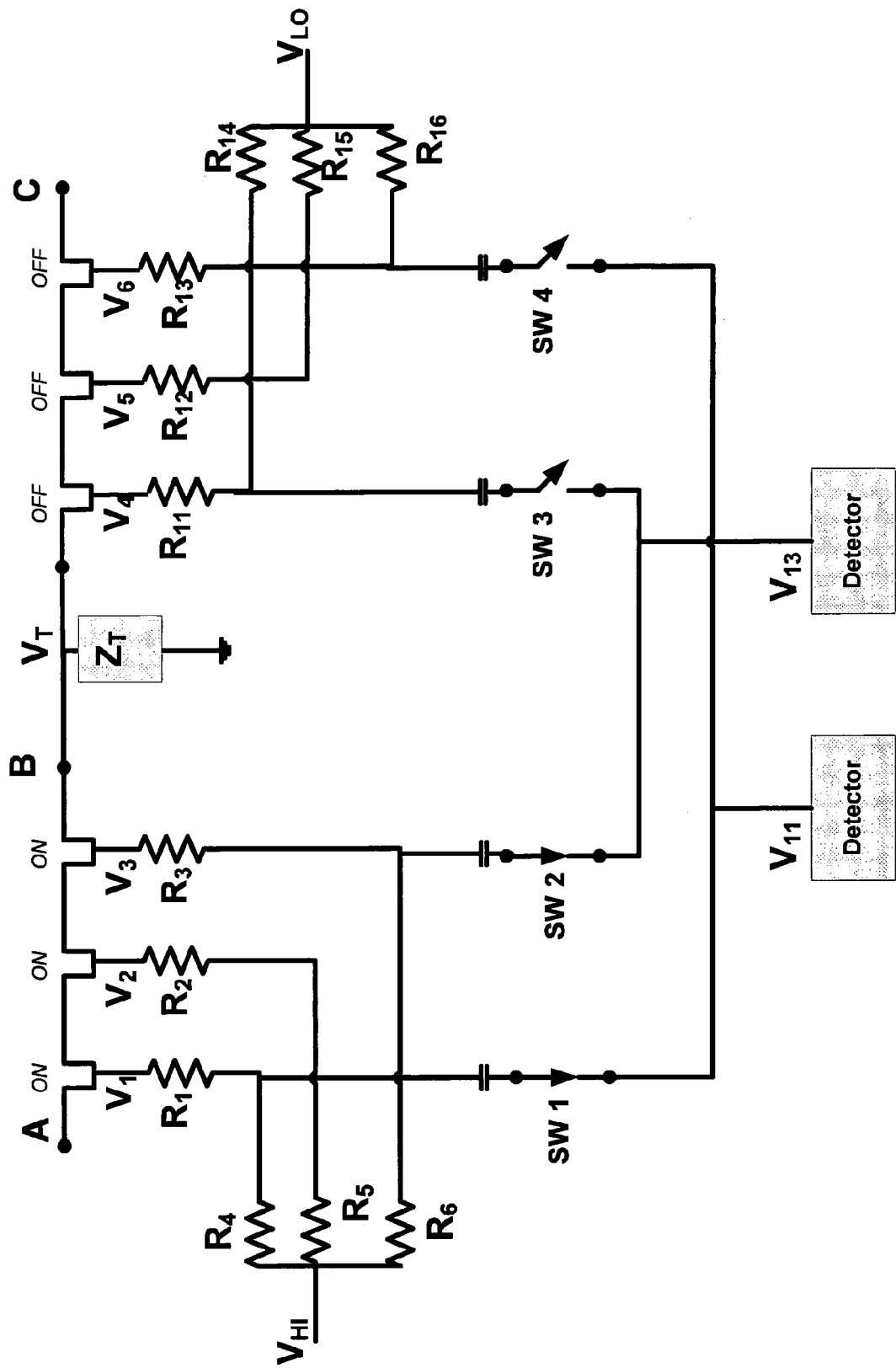

Alternatively, it may be desirable to reduce the number of detectors, and this is achieved by switching the appropriate leakage signals to just two detectors. FIG. 11 shows one possible way to do this for the case of a SPDT switch. In FIG. 11 the SPDT switch is controlled such that the transistors connecting node A and node B are on and the transistors connecting node B and node C are off. SW1 and SW2 are additional switches used to connect the leakage signals to the detectors and are closed when measuring the delivered power to the load with SW3 and SW4 open.

When the switch is controlled such that the transistors connecting node C and node B are on and the transistors connecting node A and node C are off, then SW1 and SW2 would be open and SW3 and SW4 would be closed, in order to measure the power delivered to the terminating impedance. The above embodiments involve measuring the leakage voltages at the gates of the 'ON' transistors (e.g. $V_1$ and $V_3$ in FIG. 8) or voltages derived from these voltages (e.g. $V_{11}$ and $V_{13}$ in FIG. 9). In some cases it may be advantageous to measure one or two of the leakage voltages at the gates of the 'OFF' transistors, or voltages derived from the voltages at the gates of the 'OFF' transistors. For instance the estimation of $V_T$ as shown below in Equation (13) (transistors OFF) may be less sensitive to errors in the detection circuit compared to estimating $V_T$ using equation 7 when the difference between $V_3$ and $V_1$ is small (transistors ON).

Figure 12:
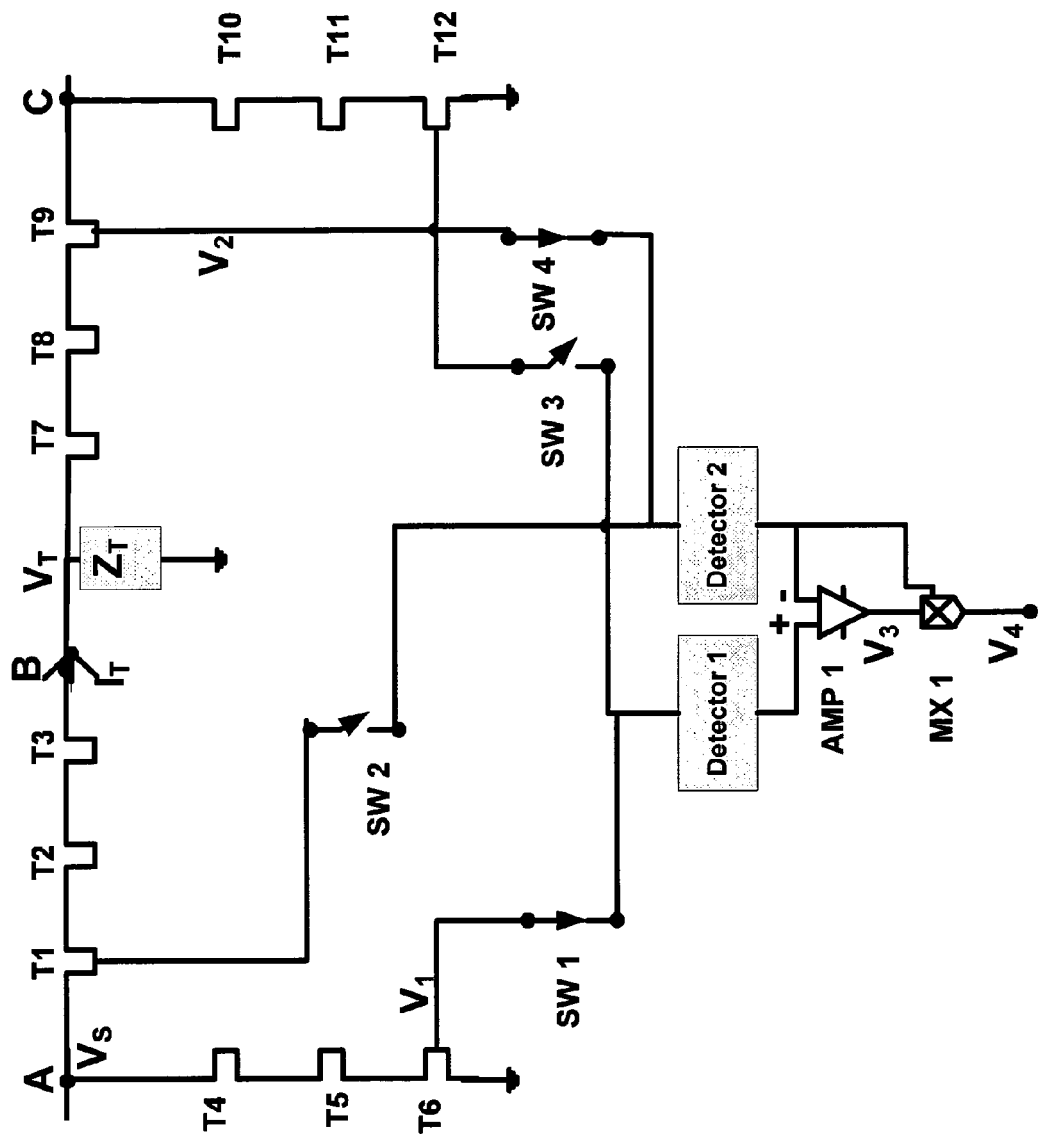

FIG. 12 is a schematic of an SPDT switch simplified for clarity with biasing resistors and bypass capacitors not shown. The switch operates with transistors T1, T2, T3 turned ON and transistors T7, T8, T9 turned OFF when connecting node A to node B. In this switch there are additional transistors which are used to increase the isolation of the OFF arm of the switch. When node A is connected to node B transistors T1, T2, T3 are turned 'ON' and transistors T4, T5, T6 are turned 'OFF' to create a low impedance between node A and node B; while transistors T7, T8, T9 are turned 'OFF' and transistors T10, T11, T12 are turned 'ON' to create high isolation between node B and node C.

When the switch is controlled in this way to connect node A to node B then the voltage at node A, Vs, is distributed evenly across the transistors T4,T5,T6 and by voltage division the voltage at the gate of transistor T6 is given by:

$$V_1 = V_S/6 \qquad \text{Equation (12)}$$

Also with transistors T10, T11, T12 turned 'ON' presenting a low impedance to ground and with transistors T7, T8, T9 turned 'OFF' and presenting a relatively high impedance the voltage at the gate of transistor T9 is approximately given by $$V_2 = V_T/6 \qquad \text{Equation (13)}$$

The current delivered to the terminating impedance can again be given by Equation (2) and combining this with Equation (12) and Equation (13) gives $$I_T = 6*(V_1 - V_2)/Z_{ONSW} \qquad \text{Equation (14)}$$

Using this with Equation (1) and Equation (13) gives $$P_D = \text{Real Part}(36*V_1*(V_1 - V_2)/Z_{ONSW} \qquad \text{Equation (15)}$$

Eqn. (15) is implemented by the estimation circuit. In this way by measuring $V_1$ and $V_2$ and knowing the impedance across the switch $Z_{ONSW}$, the circuit can deduce the power delivered to terminating impedance $Z_T$ without knowing the terminating impedance. Equation (15) can be extended to include the impact of the biasing resistors and the impedance looking into the detectors and an equation similar to Equation (11) can be derived for this circuit.

FIG. 12 shows an analogue implementation of an estimation circuit. For the case where node A is connected to node B with SW1, SW2, SW3, SW4 connected as shown then the output of Detector 1 is a voltage proportional to $V_S$ and the output of Detector 2 is a voltage proportional to $V_T$. With these two outputs connected to a differential amplifier (AMP 1), as shown, then the output voltage of the differential amplifier, $V_3$, is proportional to the current delivered to the terminating impedance. Furthermore if $V_3$ is connected to a multiplier (MX 1) and multiplied by the output of detector 2, the output of MX 1, which is $V_4$, is a voltage proportional to the power delivered to the terminating impedance.

Figure 13:
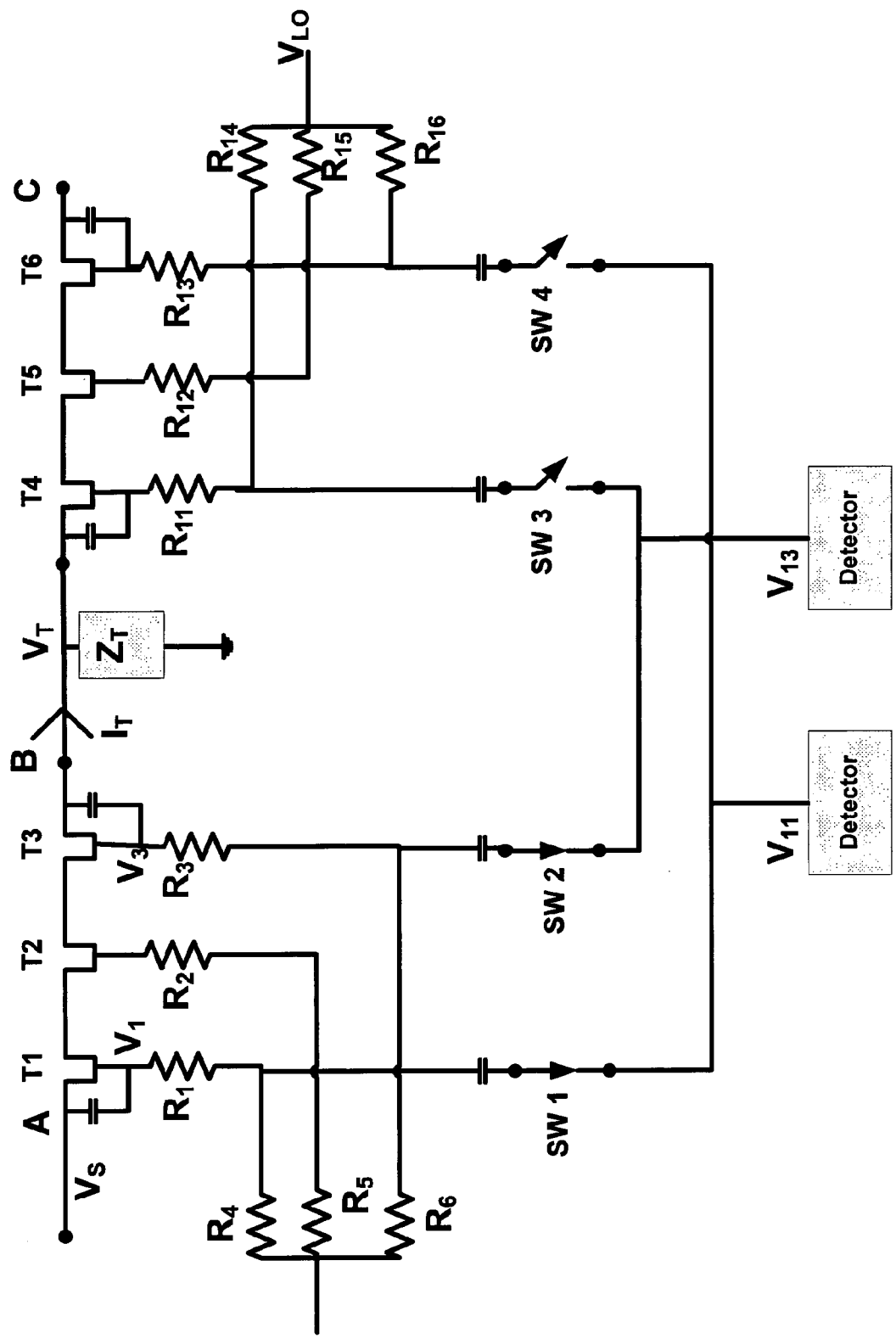

In some applications a switch is designed with a capacitor bypassing the gate to source or gate to drain junction, to increase the linearity of the switch. FIG. 13 shows an example of such a switch with bypassing on the junctions of transistors T1, T3, T4, and T6.

The power delivered to the load can again be measured in a similar manner to that described above except with the addition of the capacitors the voltage dropped across the switch is not now evenly distributed across the transistors. For example with a case where the bypass capacitors are much larger than the junction capacitors of the transistors the voltages at the gates of the transistors can be approximated by:

$$V_1 = V_S - (V_S - V_T)/4 \qquad \text{Equation (16)}$$

$$V_2 = V_S - (V_S - V_T)/2 \qquad \text{Equation (17)}$$

$$V_3 = V_S - 3*(V_S - V_T)/4 \qquad \text{Equation (18)}$$

As above, by measuring any two of the voltages $V_1$, $V_2$ and $V_3$, then the voltage drop across the switch can be deduced. For example by measuring $V_1$ and $V_3$ and using equations (16) and (18) the circuit can deduce that $$V_S - V_T = 2*(V_1 - V_3) \qquad \text{Equation (19)}$$

$$V_T = (3*V_3 - V_1)/2 \qquad \text{Equation (20)}$$

Combining equations (19) and (20) with (1) and (2) the power delivered to the load $P_D$ is given by:

$$P_D = \text{Real Part}((4*V_1*V_3 - V_1^2 - 3*V_3^2)/Z_{ONSW}) \qquad \text{Equation (21)}$$

Or instead, by measuring $V_{11}$ and $V_{13}$ and taking into account the biasing resistors and the impedance of the detector, the estimation circuit can deduce that the power delivered to the load $P_D$ can be given by:

$$P_D = \text{Real Part}((4*V_{11}*V_{13} - V_{11}^2 - 3*V_{13}^2)*((Z_D + R_1)^2/Z_D^2)/Z_{ONSW}) \qquad \text{Equation (22)}$$

In the previous examples the power delivered to the load was estimated when the transistors were operating as switches, i.e. the purpose of the circuit was to direct signal flow in one direction and prevent signal flow in another direction. The same principles apply however when the function of the transistors is to attenuate the level of the signal rather than the flow of the signal.

Figure 14:
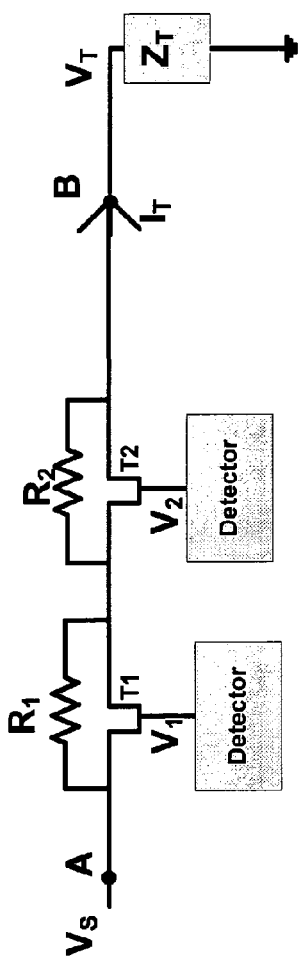

FIG. 14 shows a schematic of a simple two-bit digital attenuator with bias control circuits removed. For this example the resistors $R_1$ and $R_2$ are large compared to the resistance across the transistor when it is 'ON' and small compared to the resistance across the transistor when the transistor is 'OFF'. The circuit works as follows: when transistors T1 and T2 are 'OFF' the impedance between node A and node B is $R_1 + R_2$; when T1 is 'ON' and T2 is 'OFF' the resistance is $R_2$; when T1 is 'OFF' and T2 is 'On' the resistance is $R_1$ and when transistors T1 and T2 are 'ON' the impedance between node A and node B is as before the 'ON impedance, $Z_{ON}$, of the two transistors in series.

The power delivered to the terminating impedance can be derived in a way similar to how equation 8 was derived to give:

$$P_D = \text{Real Part}((4*V_1*V_2 - V_1^2 - 3*V_2^2)/Z) \qquad \text{Equation (23)}$$

where Z is either $R_1 + R_2$; $R_2$; $R_1$ or $Z_{ON}$ depending on which state transistors T1 and T2 are in.

As before, Equation (23) can be adapted to include the effects of bias circuits and the detector impedance.

The above embodiments (FIGS. 8 to 13) the terminating impedance is unknown and possibly changing and leakage voltages are measured to determine the power delivered to the load. In some cases the power delivered may be estimated on the basis of the load impedance not being known, but it being known that it is not changing. The fact that it is known that the load impedance is not changing means that the delivered power can be estimated even though the impedance across the attenuator switches is not known. Equation 25 can be used to calculate the power delivered to the load in these circumstances. Using Equation (25) below, Zt can be implicitly estimated using calibration mechanisms as described above.

Figure 15:
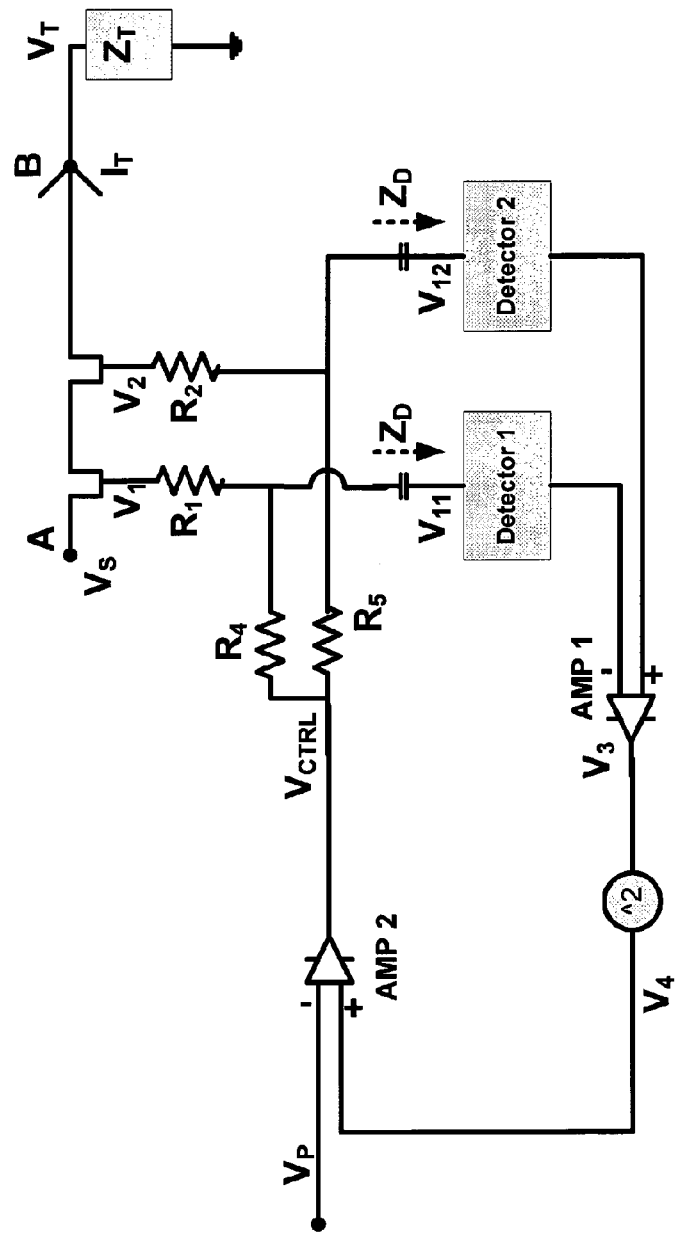

Referring to FIG. 15 transistors in a Voltage Variable Attenuator (VVA) are biased with voltages that can take any value between the voltage that turns the transistor fully 'ON' and the voltage that turns the transistor fully 'OFF'. In this way the impedance across the transistor can vary anywhere between its value when it is fully 'ON' and its impedance when it is fully 'OFF'. The control voltage $V_{CTRL}$ can be adjusted to continuously adjust the impedance between node A and node B. In this way the attenuation between node A and node B can be continuously adjusted. Using analysis similar to previous analysis if leakage voltages $V_1$ and $V_2$ are detected then the voltage at the terminating impedance $V_T$ is given by:

$$V_T = (3*V_2 - V_1)/2 \qquad \text{Equation (24)}$$

and if the terminating impedance is known, then the power delivered to the load is:

$$P_D = \text{Real Part}((-6*V_1*V_2 + V_1^2 + 9*V_2^2)4*Z_T \qquad \text{Equation (25)}$$

FIG. 15 shows one way in which estimation of the output power can be used to linearize the control of the VVA. Voltages proportional to $V_1$ and $V_2$ are detected at Detector 1 and Detector 2 and applied to the differential amplifier AMP 1. The gain of the amplifier is set so that the output voltage $V_3$ is proportional to $V_T$. For this circuit in accordance with Equation (24) the voltage gain for the signal at the positive terminal is three times the voltage gain for the signal at the negative terminal.

In FIG. 15 the estimation circuit comprises amplifiers AMP 1 and AMP 2. The signal at the output AMP 1 is applied to a squarer circuit so that the output $V_4$ is proportional to the power delivered to the terminating impedance. This signal is compared to a signal $V_P$, which can represent the desired power to the terminating impedance, in a second differential amplifier AMP 2. AMP 2 will act to keep voltages at both its input terminals equal to each other, thus as the desired power $V_P$ is adjusted, the voltage $V_4$ and consequently the output power will follow in a linear fashion.

Figure 16:
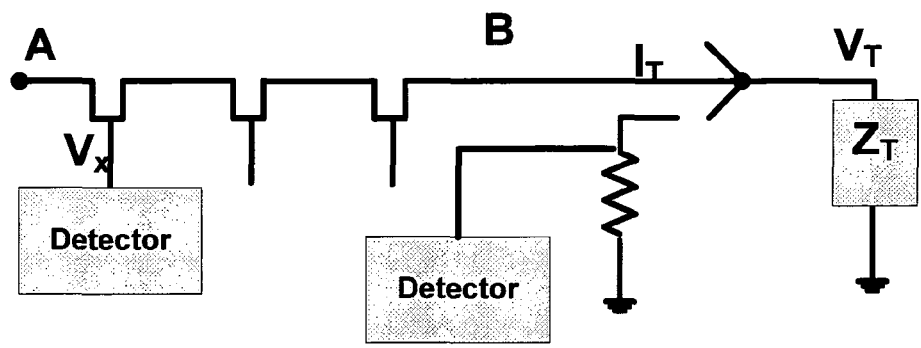

Referring to FIG. 16 in one embodiment a detector comprises an electromagnetic coupler coupled to the power delivery line and a voltage tap off the coupler. The other detector detects gate voltage for a transistor either directly or at a node connected to a gate through a bias circuit. In an estimation circuit, the power delivered to the load is estimated by:
 i) receiving a voltage proportional to the terminal voltage $V_T$ at a node in the switch connected to the gate of any transistor,
 ii) receiving a voltage across a resistor through which the electromagnetically coupled current flows, which is proportional to the current delivered to the load $I_T$ and
 iii) estimating the power delivered to the load by multiplying these two factors knowing that $P_D = \text{Real Part}(V_T * I_T)$.

Application Examples

Wireless devices such as handsets all have a component called an RF (Radio Frequency) switch that connects to the antenna. The function of the RF switch is usually to switch between different modes of operation (e.g. '3G' mode, or GSM mode) or else switch between the user transmitting and receiving.

All wireless devices also have an RF sensor that attempts to sense the power radiated by the wireless device. This sensed power is then used to control the power radiated by the wireless device to make sure there is enough power transmitted so the connection is not lost, but not too much power transmitted so that battery power is needlessly wasted.

In one embodiment, our invention embeds the RF sensor into the RF switch in a way that is more accurate, takes less space, and consumes less battery power than existing methods.

Figure 17:
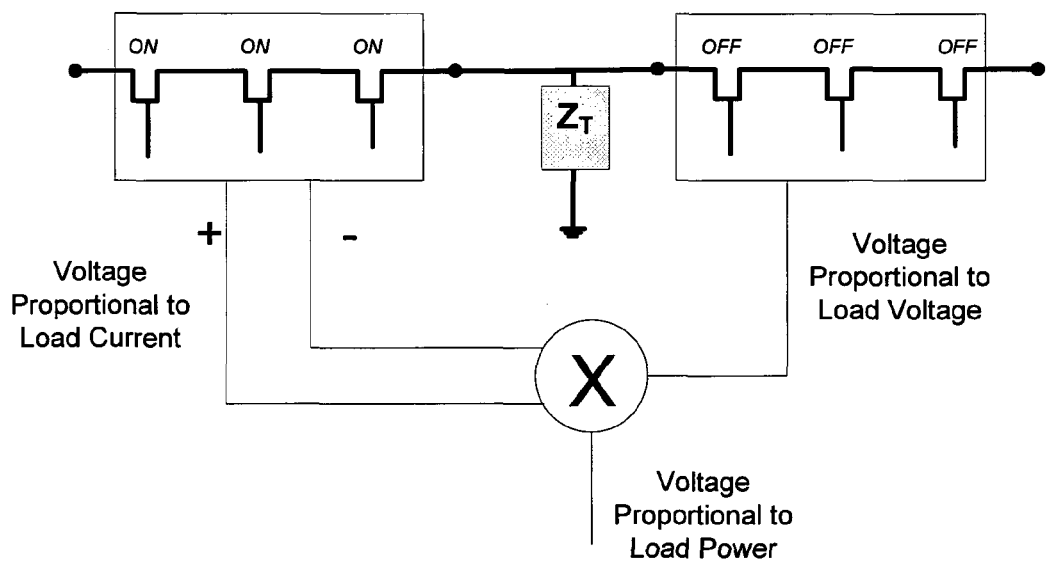

FIG. 17 shows one way how the voltages proportional to load current and voltage are combined in an analog way to give a voltage proportional to the power delivered to the load.

FIG. 18 shows an architecture for power detection in each transmit path of a multimode handset and shows how the power sensing and power detection can be integrated into a switch SP9T which drives an antenna load. The detector and estimation circuits are integrated, as shown at the bottom of the SP9T block.

FIG. 19 shows the results of circuit simulations of a switch with various phases of a 10:1 load VSWR. In these simulations the power delivered to the load is compared with the power sensed using methods described here, and the error by this method is plotted.

The invention is particularly advantageous for any circuit where gain control is achieved through continuously varying resistance across an FET by varying the gate bias of the FET. Typical applications for these circuits are in the transmit chain of a communications device where the power being transmitted has to be controlled, or in the receive chain of a communications device where the power being received is being controlled to ensure the receiver has enough gain to properly detect the signal but not too much gain so that the receiver saturates and distorts the received signal. These circuits are notoriously difficult to control in a linear manner, since the resistance across the transistors doesn't vary linearly with the bias voltage applied. The present invention provides an effective way to achieve linear gain control for such circuits.

While the above description often does not take account of all of the circuit parasitics and non-idealities that exist in real circuits, it is understood that these can be accounted for either through circuit techniques or by means of external calibration.

While the above methods often depend on knowing the impedance across the transistors, $Z_{ONSW}$, it is understood that there are different ways to do this, and these can be incorporated without affecting the scope of the invention.

The invention is not limited to the embodiments described but may be varied in construction and detail.

The invention claimed is:

1. A power delivery circuit comprising:
power delivery components including at least two FET transistors having gates, and a load terminal, wherein said power delivery components provide a power delivery path to the load terminal,
detectors for measuring voltages of two or more measuring nodes of the power delivery circuit, wherein at least two of the detectors are adapted to measure voltages of nodes connected to said power delivery component transistor gates, and
an estimation circuit for using the measured node voltages to estimate current, voltage, or power delivered to a load by the power delivery components,
wherein the estimation circuit is adapted to estimate load current $I_T$ according to a ratio of difference between the measured node voltages and a known impedance of the power delivery path.

2. The power delivery circuit as claimed in claim 1, wherein at least some of said transistors are attenuators, being adapted to operate as variable resistors.

3. The power delivery circuit as claimed in claim 1, wherein at least one of the detectors is connected to a gate of an OFF FET transistor.

4. The power delivery circuit as claimed in claim 1, comprising a plurality of transistors in series, and the detectors are adapted to measure voltages of nodes connected to only a subset of the transistors.

5. The power delivery circuit as claimed in claim 1, wherein the power delivery circuit includes a single pole double throw (SPDT) switch.

6. The power delivery circuit as claimed in claim 1, further comprising means for multiplexing node voltages to detectors, allowing a greater number of nodes than detectors.

7. The power delivery circuit as claimed in claim 1, wherein the estimation circuit is a fully analog circuit.

8. The power delivery circuit as claimed in claim 1, wherein the estimation circuit is a fully analog circuit, and wherein the analog circuit comprises a differential amplifier connected to receive as inputs two or more sensed voltages of nodes and to provide as output a voltage proportional to current delivered to the load.

9. The power delivery circuit as claimed in claim 1, wherein the estimation circuit is a fully analog circuit, and wherein the analog circuit comprises a differential amplifier connected to receive as inputs two or more sensed voltages of nodes and to provide as output a voltage proportional to current delivered to the load, and wherein the analog circuit further comprises a multiplier for receiving the amplifier output and a load voltage signal to provide an output indicating load power.

10. The power delivery circuit as claimed in claim 1, wherein at least some of the nodes are connected to the gates of the transistors on the power delivery path via biasing circuits including resistors.

11. The power delivery circuit of claim 1, wherein the estimation circuit is adapted to estimate power delivered to the load according to said measured node voltages at two nodes and impedance between said two nodes.

12. A communication device comprising a power delivery circuit delivering power to an output, wherein said power delivery circuit comprises:
power delivery components including at least two FET transistors having gates, and a load terminal, wherein said power delivery components provide a power delivery path to the load terminal,
detectors for measuring voltages of two or more measuring nodes of the power delivery circuit, wherein at least two of the detectors are adapted to measure voltages of nodes connected to said power delivery component transistor gates, and
an estimation circuit for using the measured node voltages to estimate current,
voltage, or power delivered to a load by the power delivery components,
wherein the estimation circuit is adapted to estimate load current according to a ratio of difference between the measured node voltages and a known impedance of the power delivery path.

13. The communication device as claimed in claim 12, wherein the device is a wireless communication device.

14. A power delivery circuit comprising:
power delivery components including at least two FET transistors,
a load terminal,
wherein said power delivery components provide a power delivery path to the load terminal;
detectors for measuring voltages of two or more measuring nodes of the power delivery circuit, wherein the nodes are at or connected to the power delivery component transistors but are not on the power delivery path, an estimation circuit for using the measured node voltages to estimate current, voltage, or power delivered to a load by the power delivery components;

wherein the estimation circuit is adapted to estimate load current according to a ratio of difference between the measured node voltages and a known impedance of the power delivery path.

15. A communication device comprising a power delivery circuit according to claim 14 delivering power to an output.

* * * * *

UNITED STATES PATENT AND TRADEMARK OFFICE
CERTIFICATE OF CORRECTION

PATENT NO.        : 8,570,025 B2                                              Page 1 of 1
APPLICATION NO. : 12/734716
DATED             : October 29, 2013
INVENTOR(S)       : Eugene Heaney It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 544 days.

Signed and Sealed this

Twenty-second Day of September, 2015

Michelle K. Lee
*Director of the United States Patent and Trademark Office*